United States Patent
Iruvanti et al.

[11] Patent Number: 5,825,087
[45] Date of Patent: Oct. 20, 1998

[54] INTEGRAL MESH FLAT PLATE COOLING MODULE

[75] Inventors: Sushumna Iruvanti, Wappingers Falls; Martin Klepeis, Poughkeepsie; Gaetano Paolo Messina, Hopewell Junction; Raed Sherif, Croton, all of N.Y.

[73] Assignee: International Business Machines Corporation, Armonk, N.Y.

[21] Appl. No.: 758,789

[22] Filed: Dec. 3, 1996

[51] Int. Cl.$^6$ .............................. H01L 23/10; H01L 23/34
[52] U.S. Cl. .......................... 257/707; 257/706; 257/712
[58] Field of Search ................................... 257/706, 707, 257/712

[56] References Cited

U.S. PATENT DOCUMENTS

| | | | |
|---|---|---|---|
| 4,823,863 | 4/1989 | Nakajima et al. | 165/80.4 |
| 4,920,574 | 4/1990 | Yamamoto et al. | 361/385 |
| 4,962,416 | 10/1990 | Jones et al. | 257/722 |
| 5,097,385 | 3/1992 | Chao-Fan Chu et al. | 361/382 |
| 5,098,609 | 3/1992 | Iruvanti et al. | 252/385 |
| 5,177,667 | 1/1993 | Graham et al. | 361/523 |
| 5,239,200 | 8/1993 | Messina et al. | 257/714 |
| 5,294,830 | 3/1994 | Young et al. | 257/714 |
| 5,345,107 | 9/1994 | Daikoku et al. | 257/717 |
| 5,517,753 | 5/1996 | Messina | 29/841 |

FOREIGN PATENT DOCUMENTS 63-293928  11/1988  Japan ...................... 257/707

*Primary Examiner*—Teresa M. Arroyo
*Attorney, Agent, or Firm*—DeLio & Peterson; John J. Tomaszewski; Aziz M. Ahsan

[57] ABSTRACT

An electronic module is provided comprising integrated circuit chips mounted on a substrate and having a specially designed cooling plate overlying the chip producing a gap above about 1 mil and a thermal paste or thermal adhesive between the cooling plate and the chip to facilitate heat transfer from the chip to the cooling plate. The cooling plate has a roughened area made by grit blasting and the like and having a roughness of about 0.4 to 6.4 microns or comprising a plurality of channels and corresponding protrusions overlying the chip area which roughened area penetrates the thermal paste and thermal adhesive and improves the adhesion and inhibits the flow of thermal paste from between the lower surface of the cooling plate and the upper surface of the chip during operation of the electronic module. A preferred cooling plate comprises a bead blasted roughened surface or plurality of criss-crossing channels forming protrusions having a width of less than about 1 mm and a channel width of about 1 mm to 5 mm.

16 Claims, 4 Drawing Sheets

INTEGRAL MESH FLAT PLATE COOLING MODULE

BACKGROUND OF THE INVENTION

1. Field of the Invention

This invention relates to an electronic module having enhanced module cooling properties and to a method for cooling the module and, in particular, to an electronic hermetically sealed module comprising an integrated circuit chip and a relatively thick thermal paste sandwiched in a gap between the chip and a specially designed overlying cooling plate having a roughened surface by grit blasting, etc. or having a plurality of channels or grooves forming a corresponding plurality of protrusions which are either co-planar with the surface of the plate or which extend above the surface of the plate and which roughened surface penetrates the paste and inhibit the flow of paste from between the chip and the cooling plate.

2. Description of Related Art

Integrated circuit chips mounted on substrates and particularly in an array on the substrate present special cooling difficulties. While chip size has increased over the years and power usage is more efficient than in the past, new cooling systems are still needed to remove the relatively high power density generated by the chips. The prior art is replete with different types of multi-chip modules (MCM's) designed to enclose and cool integrated circuit chips mounted on ceramic-glass substrates. In some instances, the MCM's utilize liquid coolants to cool the chips such as those described in U.S. Pat. Nos. 5,239,200; 5,294,893 and 5,177,667. Another approach to cooling has been described in U.S. Pat. No. 4,500,945 by the use of liquid cooled pistons contacting the chips within the MCM's to remove heat.

Another approach to cooling chips in MCM's has been to utilize a thermally conductive medium, such as high thermal conductivity paste, between the top of the integrated circuit chip mounted on the substrate and the lower surface of a cooling plate facing the substrate. An example of the useful, stable, high solid content, high thermal conductivity paste is disclosed in U.S. Pat. No. 5,098,609 to Iruvanti et al., which patent is hereby incorporated by reference. This compound is applied as a thin film in the gap between the top of the chip and the lower surface of the plate of the MCM. In order to properly control the amount of heat removed from the integrated circuit chip, it is desirable to determine a gap of the desired distance between the top of the chip and the lower surface of the plate and to fill that space completely with thermally conductive mediums such as the aforementioned paste.

U.S. Pat. No. 5,345,107 to Daikoku et al. discloses a cooling apparatus for an electronic device in which a cooling solid body is provided on its one surface with a number of grooves. The grooves on the cooling plate are disclosed to retain the thermal conductive grease therein so that the thermal conductive grease does not swell to the outside of contact surfaces of the electronic device and the cooling solid body. The capacity of the grooves is disclosed to be larger than the volume of the thermal grease applied between the chip and the cooling surface. It is further disclosed that the cooling plate surface have grooves which communicate with the outside of the chip surface and/or have a through hole in the cooling plate surface for communication with the outside environment for plate designs where the grooves do not extend to the outside or past the outside of the chip surface. Typical cooling plates of the patent show grooves having a 1 mm width and a groove pitch of about 6 mm to grooves having a 0.5 mm width with a groove pitch of 1.5 mm. The high thermal conductive grease was also disclosed as being about 1 mil to 4 mil thick. The disclosure of the above patent is hereby incorporated by reference.

U.S. Pat. No. 4,823,863 shows a thermal conduction device having a porous surface layer. A thermal paste is not employed and a liquid such as oil is contained in the cavities of the porous layer and the chip and cooling plate are held in close contact by the surface tension of the oil.

Many modules especially hermetically sealed modules however, now use thicker gaps above 2 mils generally about 7–9 mils and even up to 15 mil and higher. This has created problems with the effectiveness of the cooling because the thermal paste slips out of the gap due to gravity and/or power cycling or power aging during use of the module.

Bearing in mind the problems and deficiencies of the prior art, it is therefore an object of the present invention to provide a method for improving retention of a thermal paste or other such heat transfer medium such as a thermally conductive adhesive between a thermal conducting plate and an integrated circuit chip of an electronic module during power cycling or power aging which occurs during module operating conditions.

It is a further object of the invention to provide electronic modules including large multichip modules (MCM's) utilizing a thermal paste for heat transfer and where thermal paste slippage is a serious problem due to thermal mechanically induced gap changes which are pronounced due to the nature of the module.

It is yet another object of the present invention to provide a cooling plate for use in electronic modules which utilize a thermal paste between the chip surface and the cooling plate surface of the electronic module.

It is still a further object of the invention to provide electronic modules having large gaps above about 4 mils between the chip surface and cooling plate surface in which a thermal paste is employed as a heat transfer medium to cool the chip.

Still other objects and advantages of the invention will in part be obvious and will in part be apparent from the specification.

SUMMARY OF THE INVENTION

The above and other objects, which will be apparent to those skilled in the art, are achieved in the present invention which is directed in a first aspect to an electronic module comprising:

a substrate having at least one integrated circuit chip attached thereto;

a cooling plate overlying the substrate and the chip and forming a gap above about 1 mil when using a thermal adhesive and preferably above about 2 mils when using a thermal paste between the upper surface of the chip and lower surface of the plate; and a thermally conductive paste or thermally conductive adhesive between the upper surface of the chip and lower surface of the cooling plate;

wherein the cooling plate has a roughened lower surface formed by, e.g., bead blasting or comprising a plurality of specially defined channels in the lower surface of the cooling plate which channels form corresponding protrusions which are either co-planar with the surface of the plate or which extend above the surface of the plate and which roughened surface penetrates the thermal paste and inhibits the flow of thermal paste from between the chip surface and the thermal plate. Preferably the ratio of the width of the protrusion to the width of the channel is about 1:1 or lower and more preferably, the protrusions have a width less than about 1 mm.

The roughened cooling plate surface may be formed by, e.g., grit blasting, bead blasting or chemical etching to provide a textured surface characterized by having a multiplicity of randomly sized peaks and valleys wherein the surface has peaks of about 0.4 to 6.4 microns as measured by roughness instruments such as an optical scanning instrument.

In another aspect of the invention, a method for cooling at least one integrated circuit chip mounted on a substrate comprises:

providing a substrate having at least one integrated circuit chip mounted thereon;

providing a cooling plate overlying the substrate and the chip wherein a gap above about 1 mils when using a thermal adhesive and preferably above about 2 mils when using a thermal paste, is formed between the upper surface of the chip and lower surface of the plate;

providing a thermal paste or thermal conducting adhesive between the upper surface of the chip and the lower surface of cooling plate;

wherein the lower surface of the cooling plate has a roughened surface formed by e.g., bead blasting or comprising a plurality of specially defined channels in the lower surface of the cooling plate which channels form corresponding protrusions which are either co-planar with the surface of the plate or extend above the surface of the plate and which roughened surface penetrates and improves adhesion of the thermal paste and/or thermal conductive adhesive and inhibits the flow of thermal paste from between the chip surface and the lower surface of the thermal plate. Preferably the ratio of the width of the protrusion to the width of the channel is about 1:1 or lower and more preferably wherein the protrusions have a width less than about 1 mm.

For a roughened surface characterized by a textured surface having a multiplicity of peaks and valleys the surface has peaks of about 0.4 to 6.4 microns high.

In a further aspect of the present invention, a cooling plate is provided for use in electronic modules to overlie integrated circuit chips and in which a thermal paste or thermal adhesive is employed between the upper surface of the integrated circuit chip and the lower surface of the cooling plate at a thickness of about 1 mil and higher to provide a heat transfer medium to remove heat generated by the integrated circuit chip.

The cooling plate has a roughened surface which inhibits the flow of thermal paste from between the chip surface and the thermal plate. The roughened surface of the cooling plate may be made by any of a variety of techniques such as by end milling or chemical etching using photolithographic techniques for channeled surfaces. A roughened surface comprising grooves in the surface of the plate has corresponding protrusions formed by the grooves which are either co-planar with the surface of the plate or which extend above the surface of the plate and which penetrate the thermal paste when the plate overlies the chip. The channels and protrusions are typically in X and/or Y directions generally parallel to the chip edges or in criss-crossing arrangement at any angle, typically orthogonal. The protrusions may overlie only the area corresponding to the chip area or the protrusions may cover the complete surface of the cooling plate for ease of manufacture and use. It is important that the protrusions in the cooling plate be integral with the plate and that the size of the protrusions be specially correlated with the size of the channels to provide the enhanced thermal paste retention effects of the invention.

Roughened surfaces produced by, e.g., grit blasting, bead blasting or chemical etching typically have a roughness comprising peaks and valleys wherein the peaks are about 0.4 to 6.4 microns, preferably 0.8 to 3.2 microns, e.g., 1.6 to 3.2 microns. These values represent average values of the textured roughened surface typically defined as $R_a$ – the root mean squared average. The roughened surface has a plurality of peaks and valleys produced by the etching or blasting method with the height of the peaks being the aforementioned range of about 0.4 to 6.4 microns. As well known to those skilled in the art such roughened surfaces have a texture such as sandpaper comprising extremely small protrusions of the metal randomly distributed on the surface of the cooling plate, which protrusions are formed by the blasting or chemical etching process.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
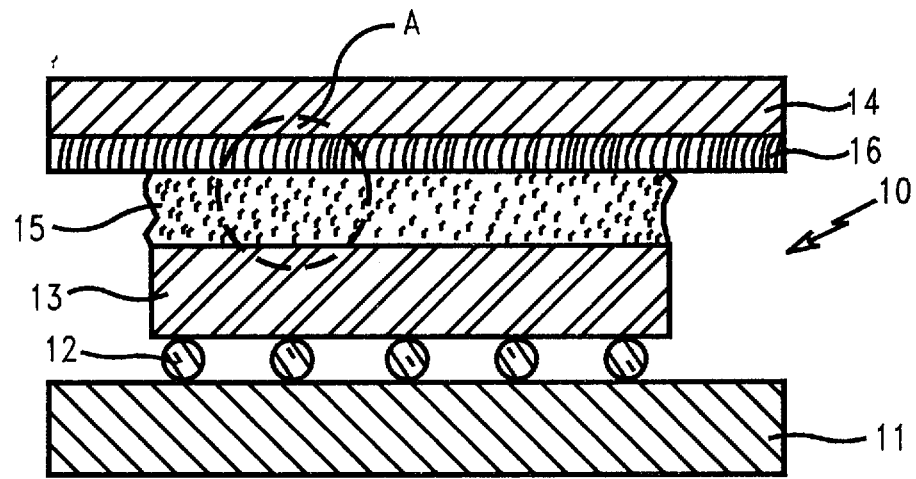
FIG. 1 is a side elevational cross-sectional view of a portion of a multi-chip module of the invention.

In describing the preferred embodiment of the present invention, reference will be made herein to FIGS. 1–7 of the drawings in which like numerals refer to like features of the invention. Features of the invention are not necessarily shown to scale in the drawings.

In FIG. 1, there is shown an electronic module 10 of the invention. The module comprises a substrate 11 having a chip 13 attached thereto by solder connections 12. Typically, the integrated circuit chips 13 are arranged in an array, such as a 5×5 array, on the top surface of substrate 11. The chips 13 are electrically connected to the substrate by a plurality of solder connections 12 which is well known in the art as "flip chip" packaging. The lower surface of the substrate 11 may contain connectors (not shown) for connection of the module to a circuit board within a mainframe computer or other electronic device.

A thermal cooling plate 14 is shown overlying the substrate and chip. The cooling plate may be any of the well-known devices generally referred to as hats or caps and the hat is generally a solid flat piece of metal or ceramic. A heat sink or cold plate is generally placed on top of the hat and may have a coolant inlet and a coolant outlet for removing heat from the hat and the module. Typically, a coolant such as water, is passed through the cold plate or air passed over the heat sink to remove the heat generated by chip 13. The cooling plate 14 may be made from any suitable material such as aluminum, copper, ceramic or components such as CuW or Al SiC.

Sandwiched between the upper surface of chip 13 and the lower surface of cooling plate 14 is a thermal conductive paste 15. The thermal conductive paste is generally provided in the form of thin film or layer covering substantially all of the top surface of chip 13 and sandwiched between top surface of chip 13 and the lower surface of plate 14. The preferred thermally conductive medium is a paste such as that disclosed in the aforementioned U.S. Pat. No. 5,098,609. The thickness of the thermal paste 15 is preestablished by design in order to optimize the heat removal from chip 13 during operation of the electronic module. The thickness of the paste for electronic modules contemplated herein will be typically above about 1 mil usually 4 mils to 15 mils and this range may vary widely depending on the electronic module and cooling results desired. The roughness of the cooling plate 14 surface is shown generally as 16 and preferably comprises either a grit or bead blasted surface or a plurality of grooves (and corresponding formed protrusions) in the cooling plate surface as more fully described hereinbelow.

Figure 2:
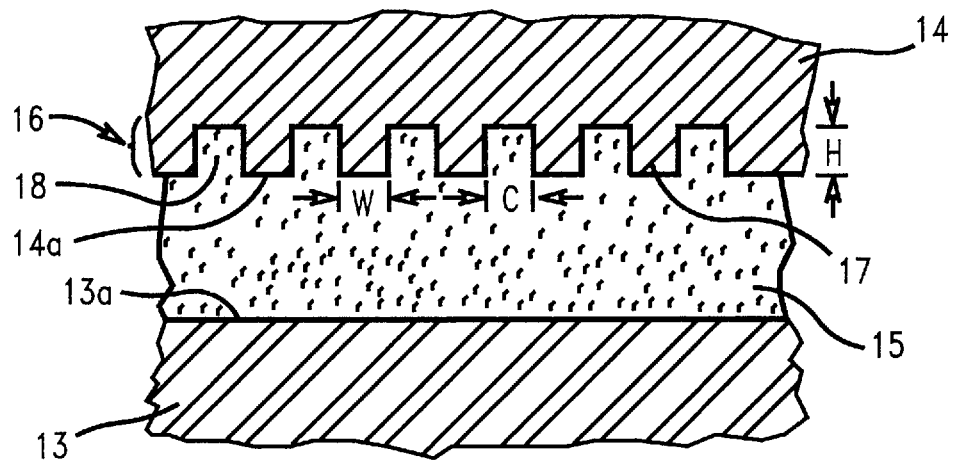
FIG. 2 is an enlarged view of section A of the multi-chip module of the invention shown in FIG. 1.

FIG. 2 is an enlarged view of section A of FIG. 1 showing in detail the channels 18 and corresponding protrusions 17 of roughened area 16. The protrusions 17 have a height H and the protrusions penetrate the thermal paste 15 and provide an inhibiting effect to the flow of the thermal paste from between the upper surface 13a of chip 13 and the lower surface 14a of cooling plate 14. The width of the protrusion 17 is shown as W and the width of the channel 18 is shown as C.

Figure 3:
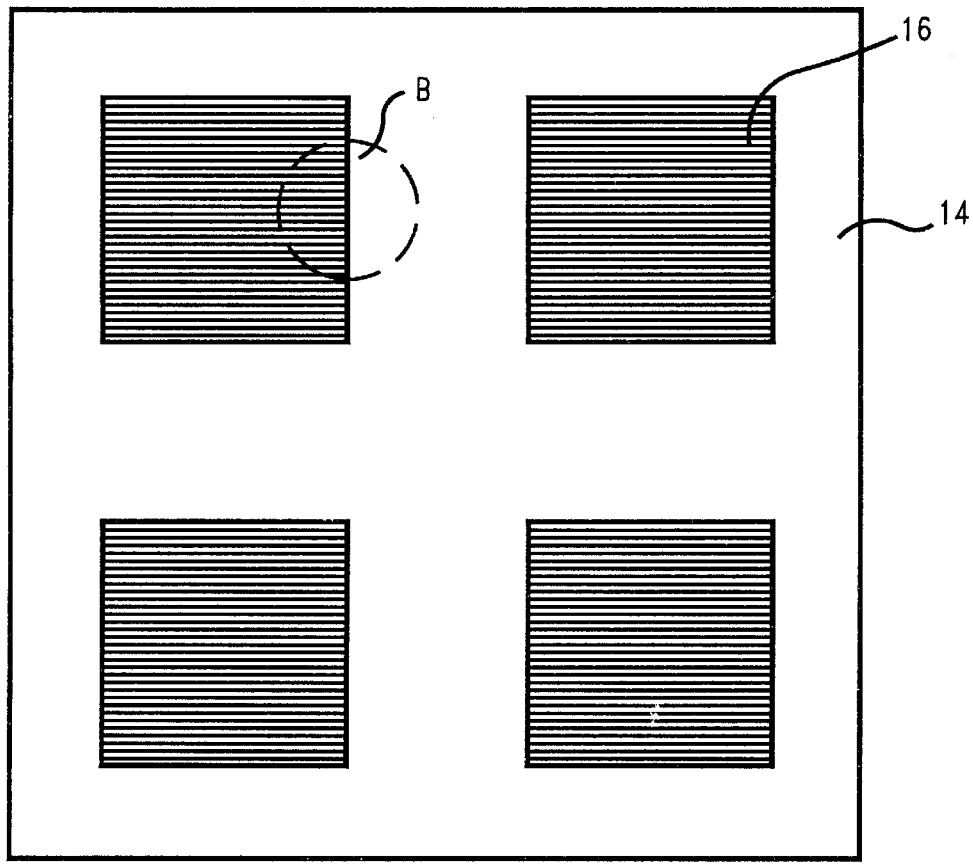
FIG. 3 is a top plan view of the lower surface of a cooling plate of the invention.

In FIG. 3, the lower surface of cooling plate 14 is shown having four roughened areas 16. These four roughened areas would overlie four integrated circuit chips 13 in a MCM and it will be appreciated that different cooling plate designs may be employed depending on the chip configuration on the substrate. The roughened areas 16 comprise parallel channels and the resulting protrusions described below and these protrusions as shown in FIG. 2 would penetrate the paste 15 and provide an adhesive effect to prevent slippage of the thermal paste 15 from between the upper chip surface 13a and lower surface 14a of cooling plate 14.

Figure 4:
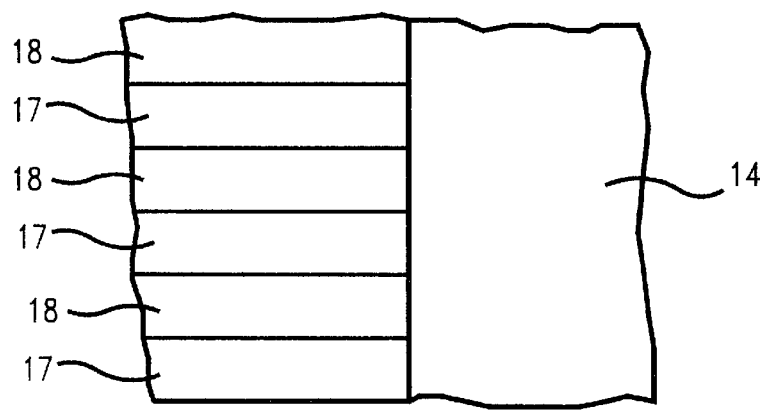
FIG. 4 is an enlarged view of section B of the cooling plate of FIG. 3.

FIG. 4 shows an enlarged view of section B of FIG. 3 and the cooling plate 14 can be seen to have a plurality of staggered channels 18 and the resulting protrusions 17 formed between the channels. Preferably the upper surface of the protrusion 17 is coplanar with the surface of the plate 14 so that there is no communication of the grooves 18 with the area outside the chip area.

Different designs can be employed for the channels 18 and protrusions 17 of cooling plate 14.

Figure 5:
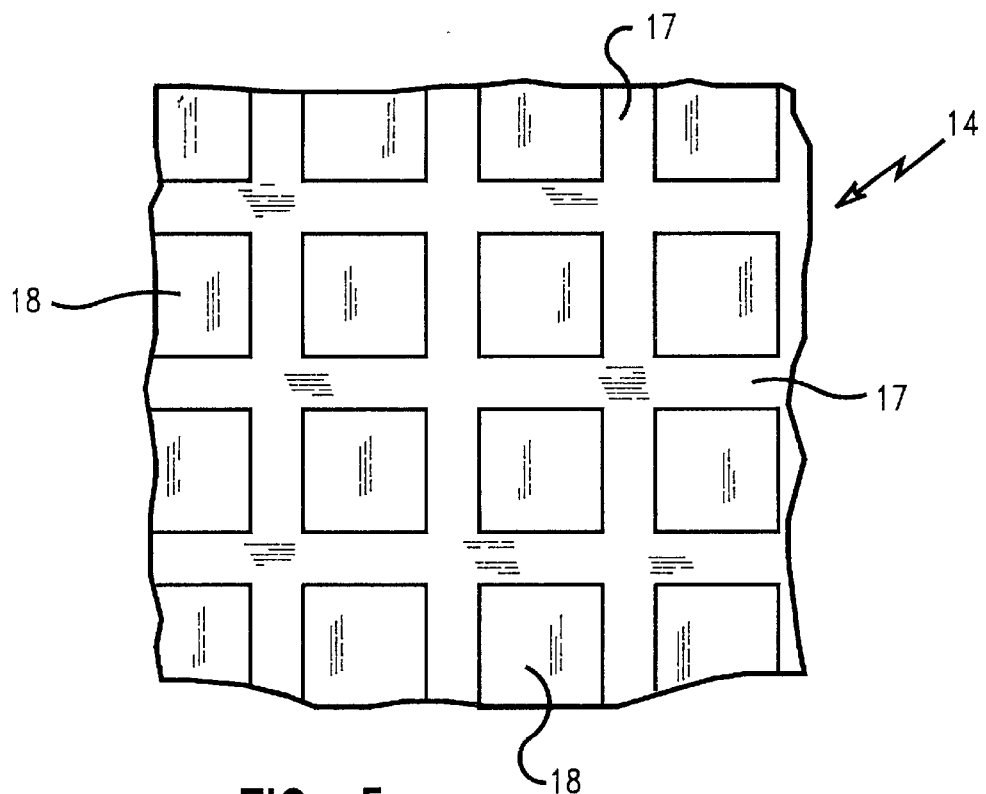
FIGS. 5, 6 and 7 are enlarged views of roughened surfaces of cooling plates of the invention.

In FIG. 5 a cooling plate 14 is shown wherein the surface of the plate has a plurality of criss-crossing integral protrusions 17 forming a grid. Thus, the protrusions 17 bound a plurality of open valley areas 18 interspersed between the grid protrusion 17. The protrusion would penetrate the thermal paste as shown in FIG. 2 and would inhibit the thermal paste from flowing out between the chip and cooling plate.

Figure 6:
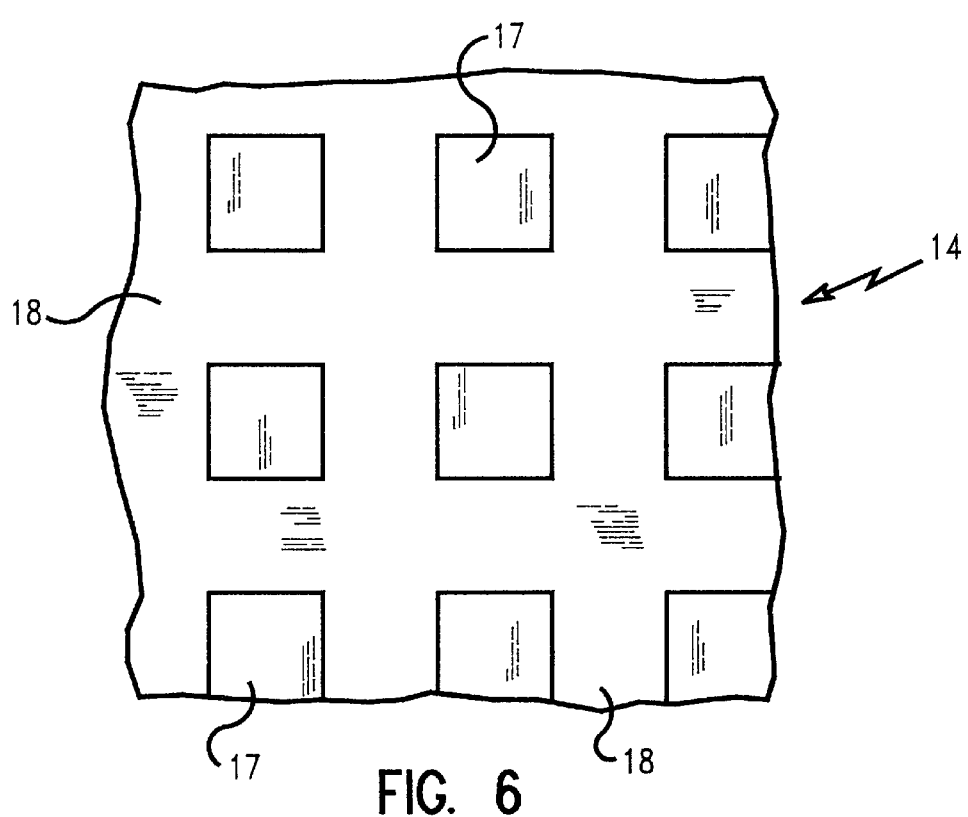
Figure 7:
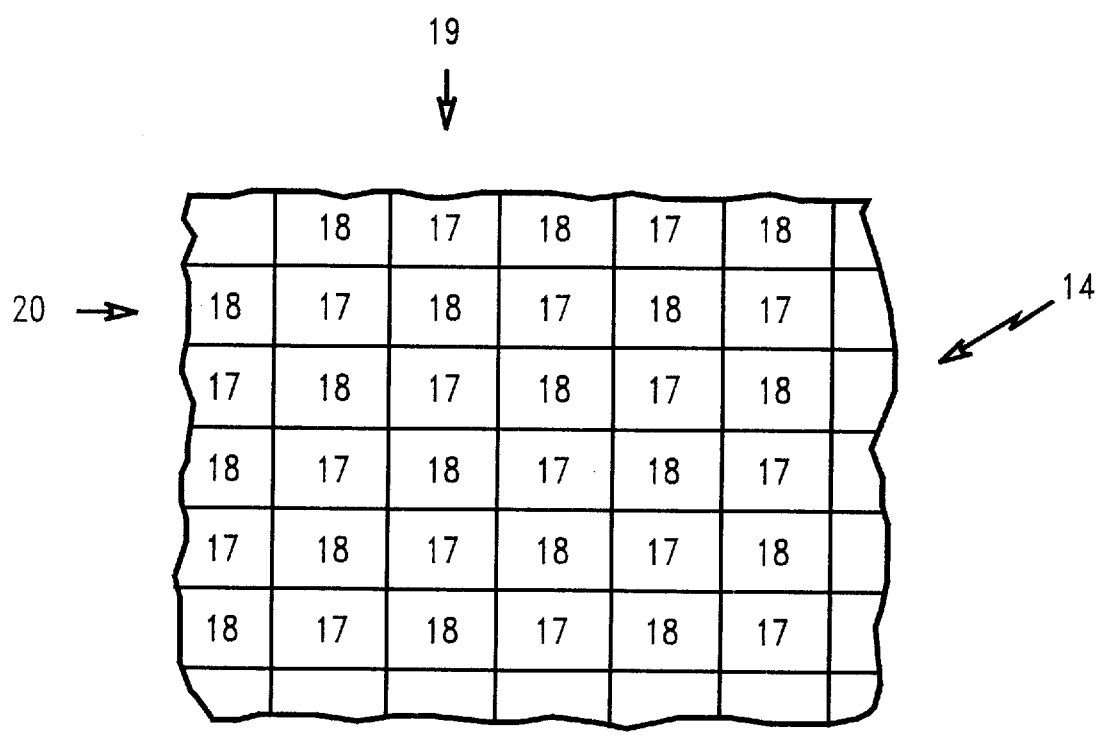

In FIG. 6 a cooling plate 14 is shown having a plurality of channels 18 crossing at right angles forming discrete protrusions 17. In FIG. 7 a cooling plate 14 is shown wherein rows 20 and columns 19 have staggered protrusions 17 and valley areas 18, forming a checkerboard configuration It is a preferred feature of the invention that the width of the protrusions(W) and the width of the channels (C) be specially correlated. Broadly stated, the width of the protrusion is preferably the same or smaller than the width of the channel. It is also preferred that the width of the protrusion be less than about 1 mm and preferably have a height H of about 10% to 60%, e.g., 15–50% of the thickness of the thermal paste. The width of the protrusions may vary widely preferably below about 1 mm depending on the use of the module and/or thermal paste used, and is preferably about 0.05 to 0.5 mm. The ratio of the width of the protrusion to the width of the channel is preferably less than about 2:1 to 1:10, most preferably 1:1 to 1:3. The width of the protrusion is defined as the larger peripheral dimension of the protrusion when the protrusion is in the form of a rectangle. For circular or other such shape protrusions, the diameter of the shape is considered its width. Variable width protrusions and channels in the same roughened area, are also contemplated to be within the invention.

For cooling plates having surfaces textured or roughened by grit or bead blasting or other means, the surface of the plate has a multiplicity of peaks and valleys wherein the surface has peaks of about 0.4 to 6.4 microns, preferably about 0.8 to 3.2 and e.g., 1.6 to 3.2 microns. The width of the peaks and valleys is also generally about the same size as the peaks.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic module comprising:
   a substrate having at least one integrated circuit chip mounted thereon;
   a cooling plate overlying the substrate and the chip and forming a gap above about 1 mil between an upper surface of the chip and an lower surface of the plate;
   a thermal paste or thermal adhesive between the upper surface of the chip and the lower surface of the cooling plate;
   wherein the cooling plate has a roughened lower surface wherein the roughened surface has a texture of peaks and valleys wherein the peaks are about 1.6 to 6.4 microns which roughened surface penetrates and improves adhesion of the thermal paste and/or thermal conductive adhesive and inhibits the flow of thermal paste from between the upper surface of the chip and the lower surface of the thermal plate.

2. The module of claim 1 wherein the periphery of the roughened lower surface of the cooling plate overlies the chip to only the periphery of the chip.

3. A cooling plate for use in electronic modules to overlie integrated circuit chips mounted on a substrate and in which a thermal paste or thermal adhesive having a thickness of above about 1 mil is sandwiched between an upper surface of the chip and a lower surface of the cooling plate to provide a heat transfer medium between the chip and the cooling plate, the cooling plate having on its lower surface a roughened area wherein the roughened area has a texture of peaks and valleys wherein the peaks are about 1.6 to 6.4 microns which roughened area penetrates and improves the adhesion of the thermal paste and/or thermal conductive adhesive and inhibits the flow of thermal paste from between the lower surface of the cooling plate and the upper surface of the chip.

4. The cooling plate of claim 3 wherein the periphery of the roughened area of the cooling plate overlies the chip to only the periphery of the chip.

5. An electronic module comprising:
   a substrate having at least one integrated circuit chip mounted thereon;
   a cooling plate overlying the substrate and the chip and forming a gap above about 1 mil between an upper surface of the chip and a lower surface of the plate;
   a thermal paste or thermal adhesive between the upper surface of the chip and the lower surface of the cooling plate;
   wherein the cooling plate has a roughened lower surface wherein the roughened surface comprises a plurality of channels in the lower surface of the cooling plate which channels form corresponding protrusions which roughened surface penetrates and improves adhesion of the thermal paste and/or thermal conductive adhesive and inhibits the flow of thermal paste from between the upper surface of the chip and the surface of the cooling plate and wherein the ratio of the width of the protrusion to the width of the channel is about 2:1 to 1:10 and the protrusions have a width less than about 1 mm.

6. The module of claim 5 wherein the channels are parallel and the corresponding protrusions have a width less than about 0.5 mm.

7. The module of claim 6 wherein the protrusions have a width less than 0.1 mm.

8. The module of claim 7 wherein the periphery of the roughened surface of the cooling plate overlies the chip to only the periphery of the chip.

9. The module of claim 8 wherein the parallel protrusions have a width of less than about 0.1 mm.

10. The module of claim 5 wherein the lower surface of the cooling plate has a roughened area defined by a plurality of crisscrossing channels which channels form corresponding discrete protrusions.

11. The module of claim 10 wherein the width of the protrusions are less than about 1 mm.

12. The module of claim 5 wherein the periphery of the roughened surface of the cooling plate overlies the chip to only the periphery of the chip.

13. A cooling plate for use in electronic modules to overlie integrated circuit chips mounted on a substrate and in which a thermal paste or thermal adhesive having a thickness of above about 1 mil is sandwiched between an upper surface of the chip and a lower surface of the cooling plate to provide a heat transfer medium between the chip and the cooling plate, the cooling plate having on its lower surface a roughened area wherein the roughened surface comprises a plurality of channels which channels form a plurality of corresponding protrusions which roughened area penetrates and improves the adhesion of the thermal paste and/or thermal conductive adhesive and inhibits the flow of thermal paste from between the lower surface of the cooling plate and the upper surface of the chip, wherein the ratio of the width of the protrusion to the width of the channel is about 2:1 to 1:10 and the protrusions are a plurality of parallel protrusions.

14. The cooling plate of claim 13 wherein the protrusions are discrete and are formed by a plurality of criss-crossing channels.

15. The cooling plate of claim 13 wherein the ratio of the width of the protrusion to the width of the channel is about 1:1 to 1:10.

16. The cooling plate of claim 13 wherein the periphery of the roughened area of the cooling plate overlies the chip to only the periphery of the chip.

* * * * *